US006412786B1

United States Patent
Pan

(10) Patent No.: US 6,412,786 B1
(45) Date of Patent: Jul. 2, 2002

(54) DIE SEAL RING

(75) Inventor: Jui-Hsiang Pan, Hsin-Chu (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/449,245

(22) Filed: Nov. 24, 1999

(51) Int. Cl.⁷ ............................ F16T 15/02; H01L 21/00
(52) U.S. Cl. ...................... 277/630; 277/654; 277/919; 438/462; 438/672
(58) Field of Search ................................ 277/630, 650, 277/652, 653, 654, 919; 438/672, 666–669, 738, 281, 132, 333, 601, 462; 257/620

(56) References Cited

U.S. PATENT DOCUMENTS

| | | | | |
|---|---|---|---|---|
| 3,968,193 A | * | 7/1976 | Langston, Jr. et al. | 264/61 |
| 4,363,076 A | * | 12/1982 | McIver | 361/386 |
| 4,700,473 A | * | 10/1987 | Freyman et al. | 29/846 |
| 5,891,808 A | * | 4/1999 | Chang et al. | 438/740 |
| 5,907,788 A | * | 5/1999 | Kasai | 438/622 |
| 5,918,123 A | * | 6/1999 | Yang | 438/253 |
| 5,966,634 A | * | 10/1999 | Inohara et al. | 438/687 |
| 5,970,346 A | * | 10/1999 | Liaw | 438/281 |
| 5,972,788 A | * | 10/1999 | Ryan et al. | 438/634 |
| 6,043,115 A | * | 3/2000 | Pan | 438/199 |
| 6,100,118 A | * | 8/2000 | Shih et al. | 438/132 |
| 6,162,686 A | * | 12/2000 | Huang et al. | 438/281 |

* cited by examiner

Primary Examiner—Lynne H. Browne
Assistant Examiner—Alison K. Pickard
(74) Attorney, Agent, or Firm—Thomas T. Moga, Esq.; Powell, Goldstein, Frazer & Murphy LLP

(57) ABSTRACT

The present invention proposes a die seal ring. The provided die seal ring is formed on a substrate and is used to encompass a die by locating between the die and adjacent scribe lines. Moreover, the provided die seal ring comprises a plurality of dielectric layers and a plurality of metal structures, wherein any metal structure is not overlapped with other metal structures. Moreover, dielectric layers are located on the substrate in sequence, and each metal structure is stacked by one metal ring and one metal plug. In addition, any metal ring is located on a dielectric layer and is covered by another dielectric layer, and metal rings of different metal structures are located on different dielectric layers. Further, any metal plug is located in the dielectric layers and is used to connect the metal ring to the substrate. Of course, if the aspect ratio of any metal plug is too large to be properly formed, an appendant metal ring is used to reduce the aspect ration of the metal plug. Therefore, owing to the fact that any metal ring can directly connect to the substrate without application of another metal ring except the aspect ration is too large, the height of any metal structure can be efficiently reduced and then the height of the presented seal ring also can be efficiently reduced.

17 Claims, 5 Drawing Sheets

DIE SEAL RING

BACKGROUND OF THE INVENTION

1. Field of the Invention

The present invention relates to packaging fabrication, and, more particularly, to a seal ring that is located around a die for preventing the internal circuit of the die from later stress induced during the period of cutting wafers.

2. Description of the Prior Art

In the semiconductor process, a plurality of dies, each of which contains an integrated circuit (IC), are fabricated on a semiconductor wafer at a single time. Scribe lines are provided between every two adjacent dies so that these dies can be separated by cutting the semiconductor wafer along these scribe lines. However, when a wafer is cut into a plurality of dies, lateral stress is induced, thereby affecting the internal circuits via the structure of the IC.

One approach for solving such a problem is to form a die seal ring between the scribe line and the peripheral region of the internal circuit. Therefore, stress induced by cutting wafers is generally blocked by the die seal ring and will not directly affect the internal circuit of a die. FIG. 1 shows a top view of a die. It should be noticed that all subsequent figures are not to scale. As FIG. 1 shows, each die 10 is separated from other die 10 by scribe lines 12, and each die 10 is encompassed by one die seal ring 14. With respect to die seal ring 14, a stacked structure comprising metal rings and dielectric layers, this component is usually formed together with die 10 in the multi-metal interconnection process.

FIG. 2 (prior art) qualitatively illustrates a cross-sectional view of conventional die seal structure. Herein, the illustrated example is a die seal ring with a triple-metal interconnection. Now referring to FIG. 2, the whole structure is formed on substrate 20, and isolation 21 is used to separate the die seal ring and internal circuit (chip), such as die 10. Die seal ring comprises first dielectric layer 22, second dielectric layer 23, third dielectric layer 24 and fourth dielectric layer 25, wherein second dielectric layer 23 is located on first dielectric layer 22, third dielectric layer 24 is formed on second dielectric layer 23 and fourth dielectric layer 25 is the uppermost layer.

Metal rings 26 and 28 locate on dielectric layer 22,23 and 24, respectively. And metal plugs 295 are located between these metal rings. Moreover, metal plugs 295 also are used to connect these blocks to substrate 20 and then any charger appear in these metal rings and metal plugs 295 are short to a ground point. Finally, passivation 29 is formed and covers all these dielectric layers and all these metal rings. In summary, conventional die seal ring shown in FIG. 2 is produced by alternately forming these dielectric layers and these metal rings by common semiconductor process and do not require extra steps. Moreover, these metal rings and metal plugs 295 are also formed during the common metallization and plug process and do not require extra steps. Such a die seal ring is utilized to enhance robustness to sawing stress, thereby preventing the internal circuit from relative damage.

As shown in FIG. 2, because the net height of the conventional die seal ring is directly proportional to the summation of heights of all metal rings, it is clear that the net weight is large as height of any metal ring is large or number of metal rings is increased. Owing to the truth that die 10 is surrounded by die seal ring 14 and then any layer formed on die 10 also is contiguous to die seal ring 14, and usually upper layers are dielectric layers such as passivation layers that with a viscosity. Therefore, it is obvious that surface of die 10 is not planar, even when a planarizing process had been executed.

Significantly, when die 10 only includes elements that will not interact with external light, such as memory cells, the uneven surface of die 10 will not induce any disadvantage. But when die 10 comprises photodetector pixel cell that is used to detect external light which will propagate through these upper layers, the uneven surface will induce an issue that sensitivities of different pixel cells is different if they are located on different part of die 10, and then the quality of die 10 is degraded.

Accordingly, it is clear that conventional die seal ring will induce the issue of uneveness of the surface of the die, and then it is desired to develop a die seal ring that efficiently prevents this issue.

SUMMARY OF THE INVENTION

The primary object of the present invention is to propose a new structure for a of die seal ring.

A further object of the present invention is to propose a die seal ring that efficiently prevents surface transmutation of the surrounding chip.

Moreover, a specific object is to propose a manufacturable die seal ring, regardless of structure of fabricating process of the proposed die seal ring.

In order to achieve these objects, the present invention proposes a die seal ring as an embodiment. The embodiment is formed on a substrate and can be used to both prevent lateral stress, which may damage the internal circuit in a due, and prevent the height of die seal ring from becoming too large to damage the smoothness of the enclosed integrated circuit.

Moreover, the provided die seal ring comprises a plurality of dielectric layers and a plurality of metal structures, wherein any metal structure is not overlapped with other metal structures. Dielectric layers are located on substrate in sequence, and each metal structure is stacked by one metal ring and one metal plug. Herein, any metal ring is located on a dielectric layer and is covered by another dielectric layer, and metal rings of different metal structures are located on different dielectric layers. Further, any metal plug is located in the dielectric layers and is used to connect the metal ring to the substrate. Of course, if the aspect ratio of any metal plug is too large to be properly formed, an appendant metal ring is used to reduce the aspect ration of the metal plug.

Significantly, because any metal ring can directly connect to the substrate without application of other metal ring except for its aspect ration being too large, the height of any metal structure can be efficiently reduced and then the height of the presented seal ring also can be efficiently reduced.

BRIEF DESCRIPTION OF THE DRAWINGS

Other objectives, features, and advantages of the proposed invention will become apparent from the following detailed description made with reference but not-limiting embodiment. The description is made with reference to the accompanying drawings, in which.

DESCRIPTION OF THE PREFERRED EMBODIMENT

Figure 3:
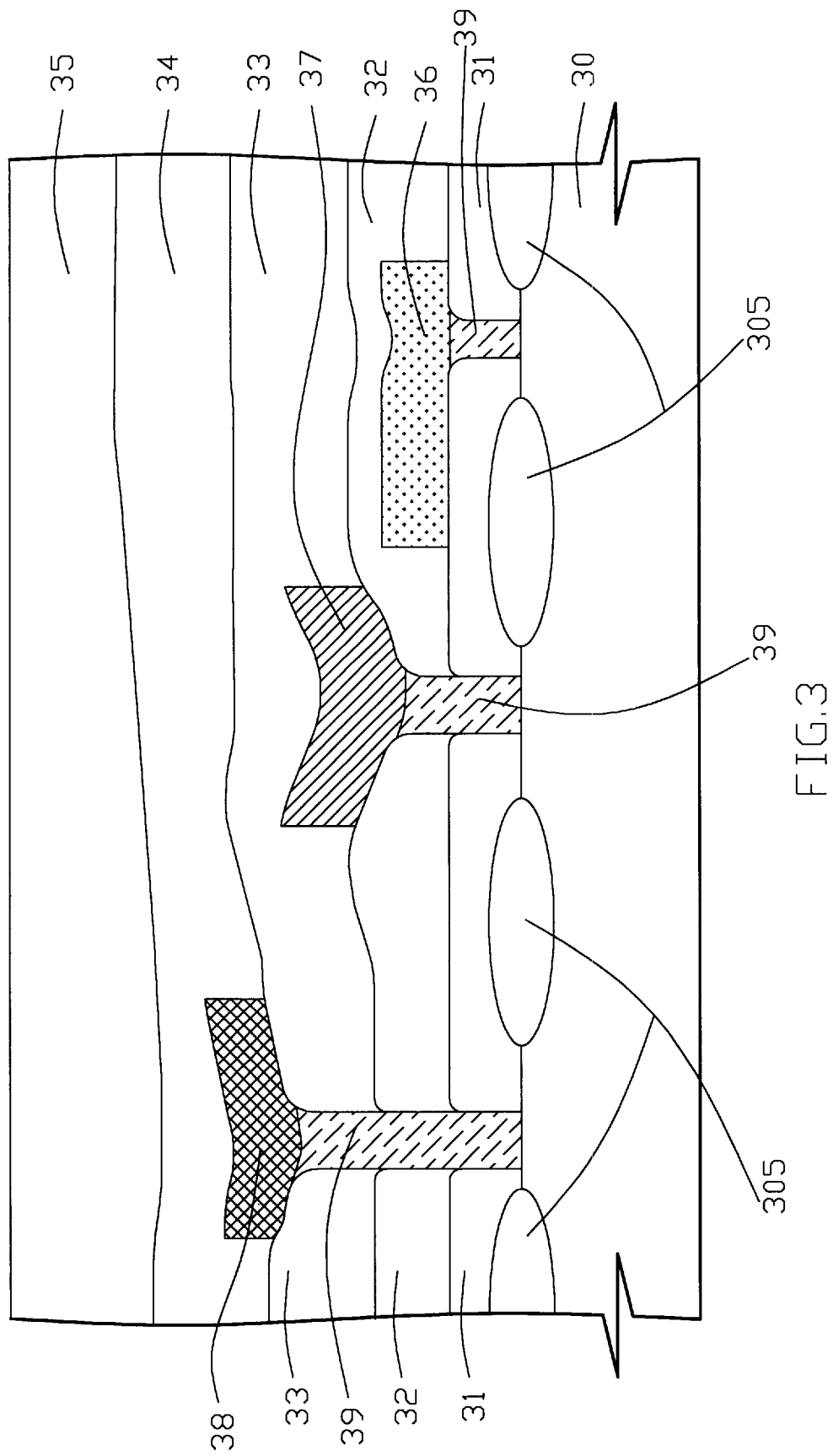
FIG. 3 and FIG. 3A are two qualitative cross-sectional illustrations about the structure of a die seal ring that is according to one embodiment of the invention.

Referring to FIG. 3, the presented die seal ring is formed on substrate 30 and comprises a plurality of dielectric layers and a plurality of metal structures. In addition, the presented embodiment demonstrates the use of three metal structures, but the number of metal structures does not limit applicability of the invention.

As FIG. 3 shows, these dielectric layers are located on substrate 30 and consist of first dielectric layer 31, second dielectric layer 32, third dielectric layer 33, and fourth dielectric layer 34. First dielectric layer 31 is the nether most layer and second dielectric layer 32, third dielectric layer 33, fourth dielectric layer 34 are formed on first dielectric layer in sequence. And fifth dielectric layer 35 is the uppermost layer. In addition, first dielectric layer 31 usually is a borophospho-tetratthyl-orthosilicate layer. The present die seal ring further comprises fifth dielectric layer 35 which is a planimetric layer and is required when the seal ring is used to surround a die within a lot photodetector pixel cells.

Also as shown in FIG. 3, there are three metal structures in the presented embodiment. The first metal structure is composed of first metal ring 36 and one metal plug 39, second metal structure is composed of second metal ring 37 and another metal plug 39, and third metal structure 39 is composed by third metal ring 38 and the other metal plug 39. Further, first metal ring 36 is formed on first dielectric layer 31 and covered by second dielectric layer 32, second metal ring 37 is formed on second dielectric layer 32 and covered by third dielectric layer 33, and third metal ring 38 is formed on third dielectric layer 33 and covered by fourth dielectric layer 34. Beside, metal plugs 39 connect first metal ring 36, second metal ring 37 and third metal ring 38 to substrate 30, respectively.

Obviously, each metal structure is stacked by one metal ring and one metal plug. Further, any metal ring is located on a dielectric layer and is covered by another dielectric layer, and metal rings of different metal structures are located on different dielectric layers. And any metal plug is located in these dielectric layers and is used to connect a metal ring to substrate 30. Varieties of material of metal rings comprise aluminum and copper, and varieties of material of metal plugs comprise copper and tungsten.

However, it should be noted that bottom of second metal ring 37 is below the top of first metal ring 36, and the bottom of third metal ring 38 also is below the top of second metal ring 37. This is a significant difference between the invention and conventional structures.6

Furthermore, it also should be noticed that any metal structure is not overlapped with other metal structures. In other words, any metal ring is not overlapped with other metal rings, this is a significant difference between the invention and conventional structure.

Figure 1:
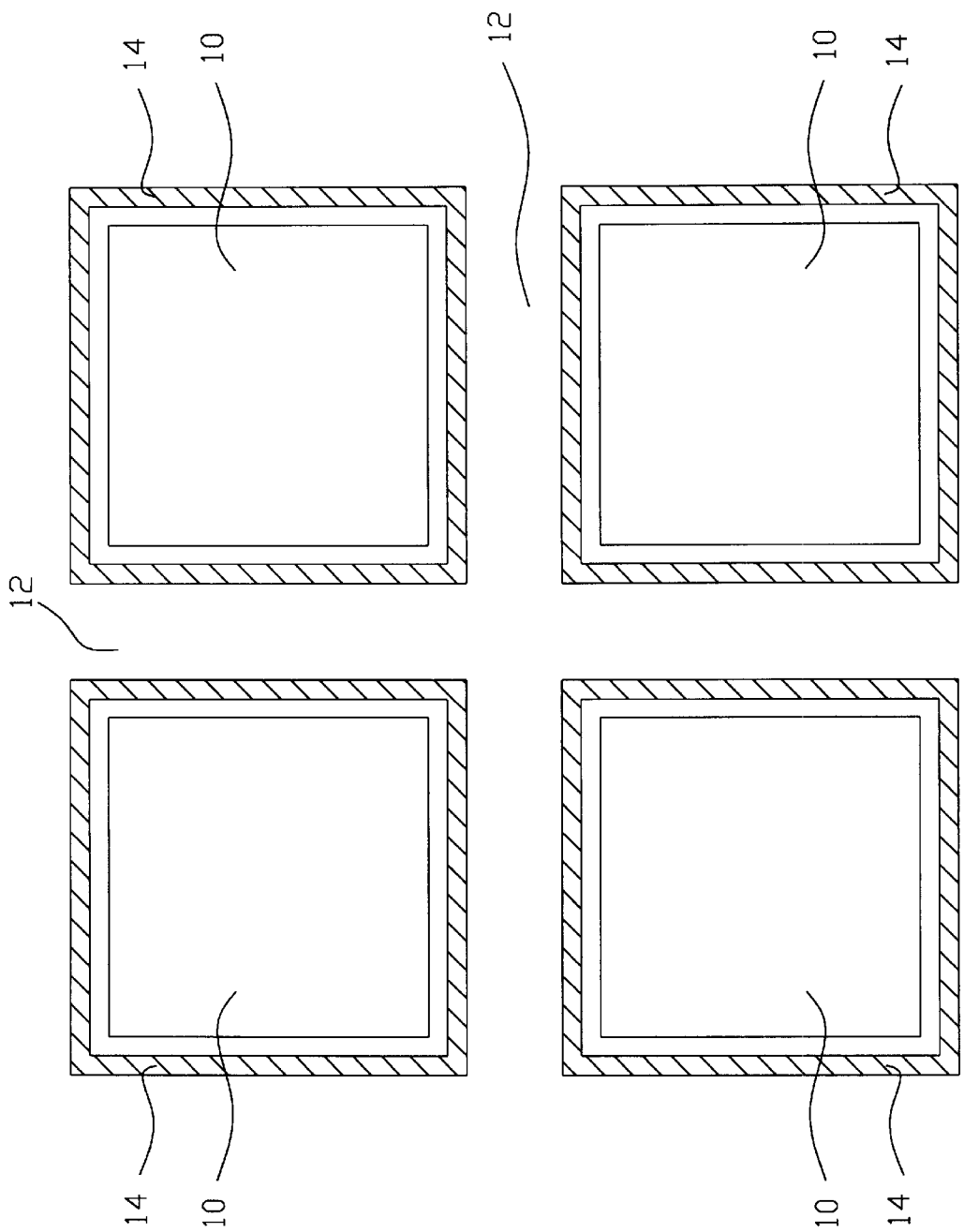
FIG. 1 is a top view after sawing a fraction of a wafer.
Figure 2:
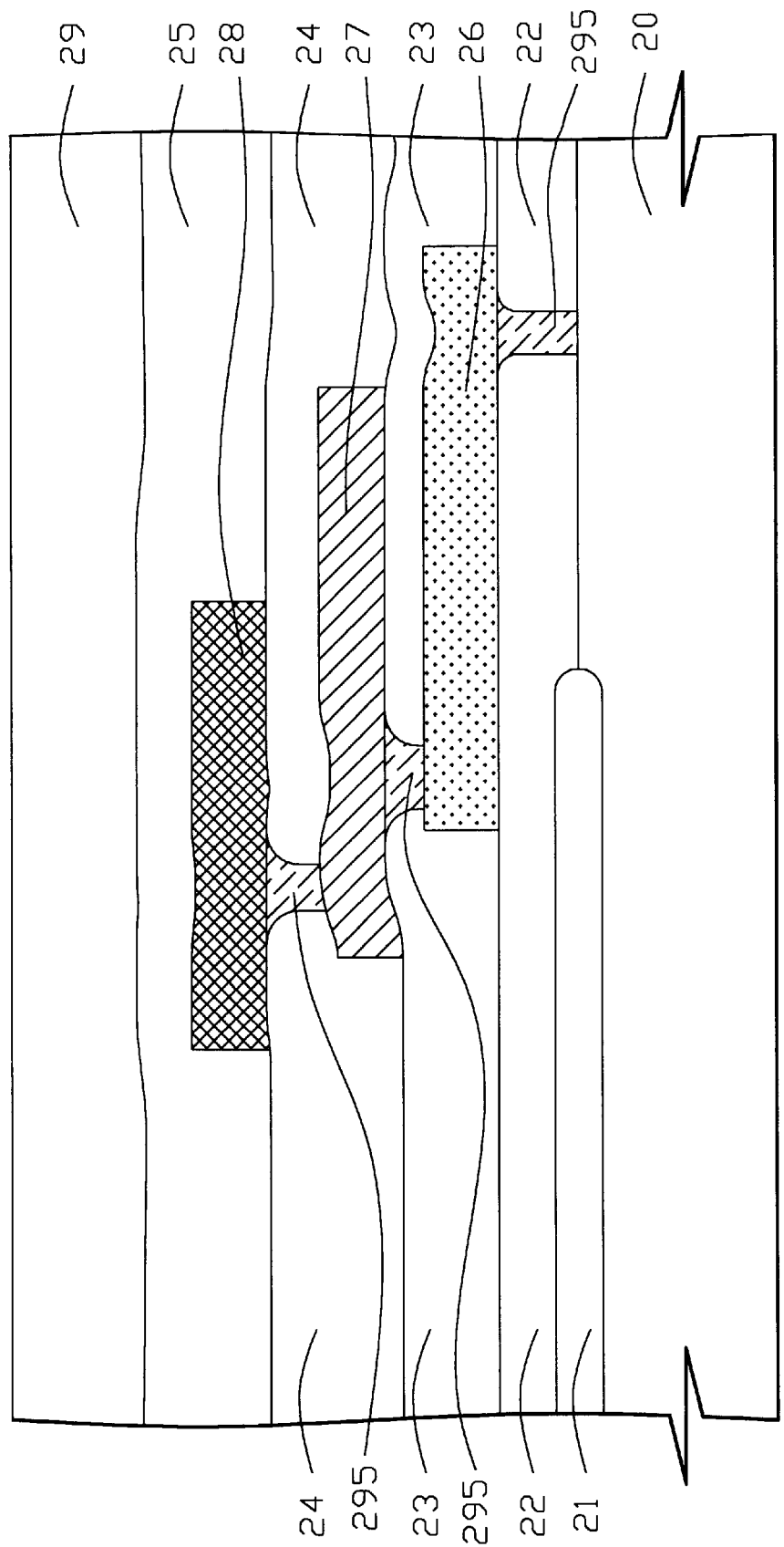
FIG. 2 is a qualitative cross-sectional illustration of one conventional structure of a die seal ring.

Because metal rings that locate on different dielectric layers will not overlap with each other, it is possible to form different metal rings on the same height above substrate 30. To compare with FIG. 2, it is significant that in conventional seal ring, different metal rings are stacked in vertical direction and then the height of the die seal ring must be larger than the summation of height of all metal rings. But in the invention, as FIG. 3 shows, different metal rings are not stacked and then the height of the die seal ring can be less than the summation of height of all metal rings. Therefore, the issue of conventional seal rings in which the smoothness of surface of the die is degraded by high seal ring, is efficiently overcome by the proposed die seal ring.

Significantly, if the die that surrounded by the presented die seal ring only includes memory cells or logic circuits, unevenness of the surface of the die will not affect the quality of these cells or circuits, and then advantage of the invention is not obvious. But when the die comprises photodetector pixel cell that are used to detect external light which will propagate through the surface of the die, one advantage of the invention is significant that sensitivities of different pixel cells are approximately equivalent even though they are located on different part of die. The reason is that the surface of the die is smooth for the presented die seal ring can efficiently enhance the smoothness of the die.

Figure 3A:
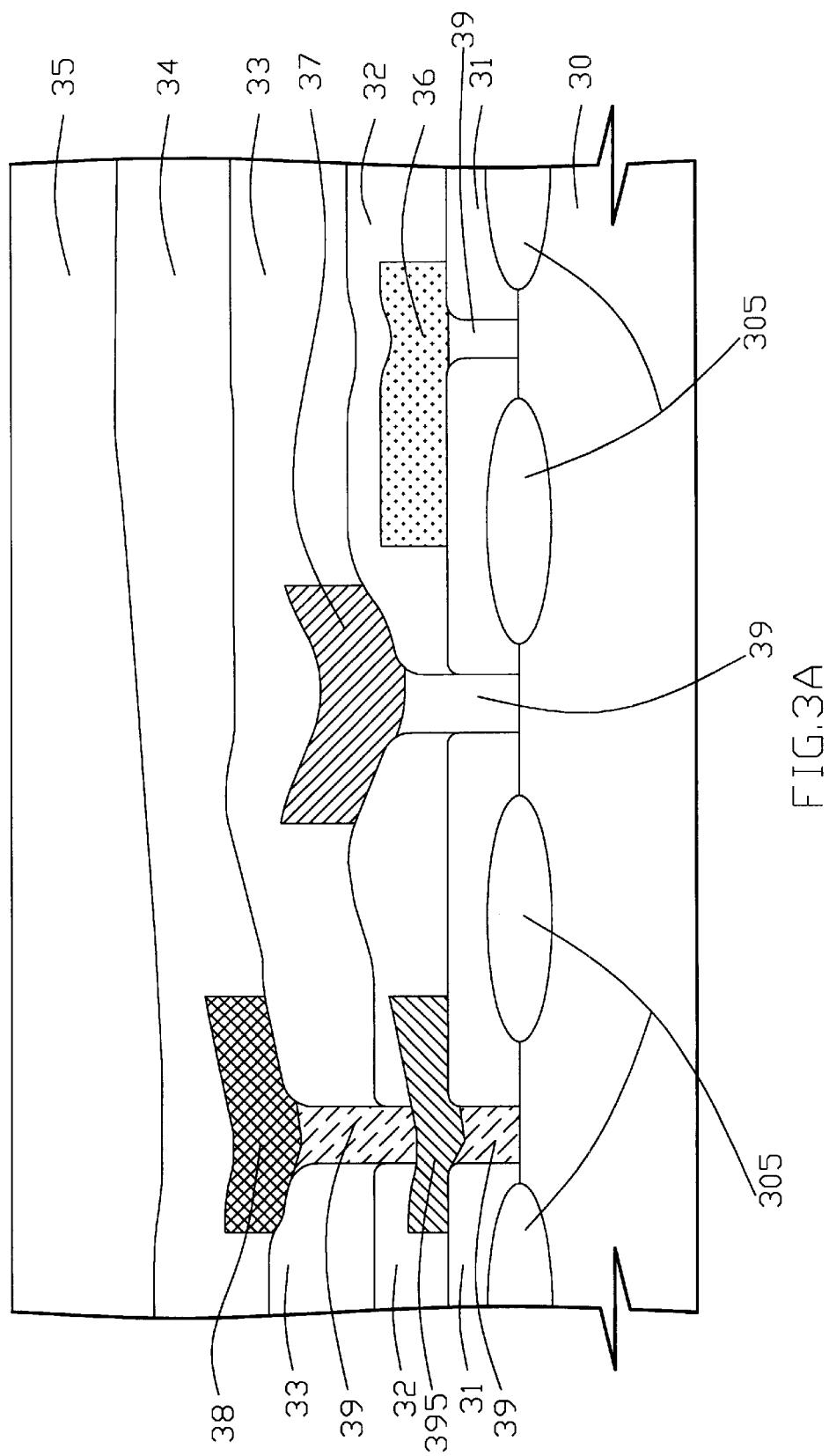

If the aspect ration of any specific metal plug is too large to be properly formed, i.e. conductivity of the specific metal plug will not be good enough to conduct charger. Then, as FIG. 3A shows, the embodiment further comprises the step of forming appendant metal ring 395 in the specific metal plug, such as metal plug 39, to reduce aspect ration of metal plug, where appendant metal ring 395 also is formed on a dielectric layer, such as first dielectric layer 31, and is covered by another dielectric layer, such as second dielectric layer 32.

Of course, the presented die seal ring further comprises a plurality of isolations 305, such as field oxides, that locate on substrate 30. Herein, isolations 305 are used to separate any metal structures from other metal structures. Isolations 305 also are used to separate the presented die seal ring and a die that is encompassed by the presented die seal ring.

Furthermore, substrate 30 further comprises diffusion region 307 that is connected to a ground point. Metal plugs 39 are connected to diffusion region 307 to let any chargers appear on these metal structures are short to ground. Wherein chargers usually is produced during etching process of metallization.

The advantages of the proposed invention can be further explained in following paragraphs with an important example: the die of the photodetector.

Figure 4A:
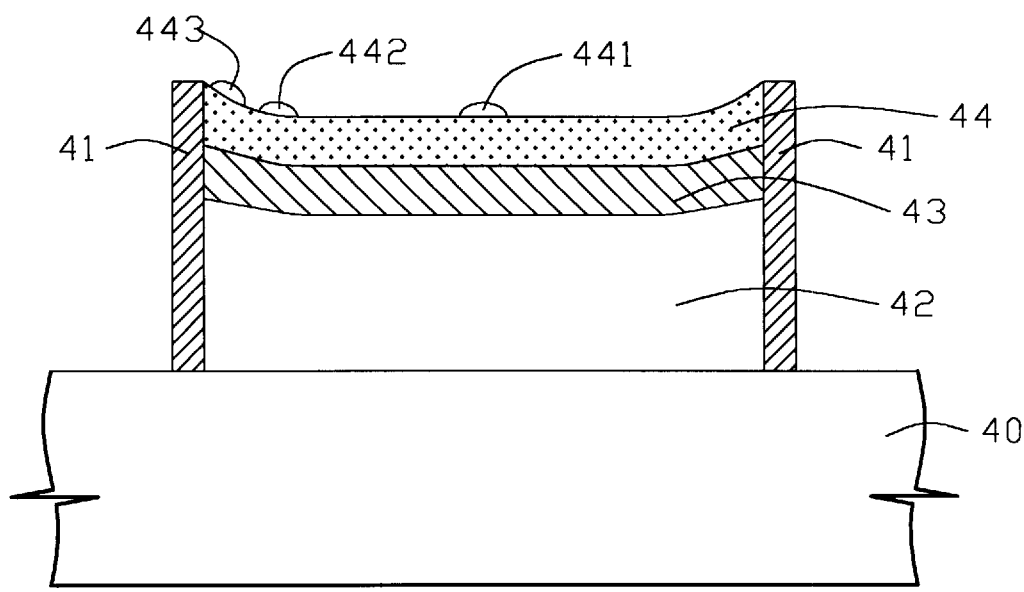
FIG. 4A and FIG. 4B are two qualitative cross-sectional illustrations that are used to illustrate the issue of conventional die seal ring and advantage of the proposed invention.

Referring to FIG. 4A where conventional die seal ring 41 is used, the die is formed on substrate 40 and is enclosed by die seal ring 41, wherein the die includes a plurality of structures 42, passivation layer 43 and color filter layer 44. Moreover, a plurality of microlens also formed on color layer 44 but in order to simplify FIG. 4A, only three microlens are 441, 442 and 443 are illustrated.

Obviously, because both passivation layer 43 and color filter layer 44 are not regid and have a specific viscosity, it is natural that the center parts of both passivation layer 43 and color filter layer 44 are briefly smooth and edge parts of both passivation layer 43 and color filter layer 44 are upwardly flexural. Therefore, it is observed that the performance of microlens 441 is good, performance of microlens 442 is slightly degrade, and performance of microlens 443 is significantly degraded. In other words, because pixel cells that locate on different positions have different performance, such as luminousness, pixel cells that locate on different portion of substrate 40 will have different sensitivity. And then the quality of the photodetector is degraded.

Figure 4B:
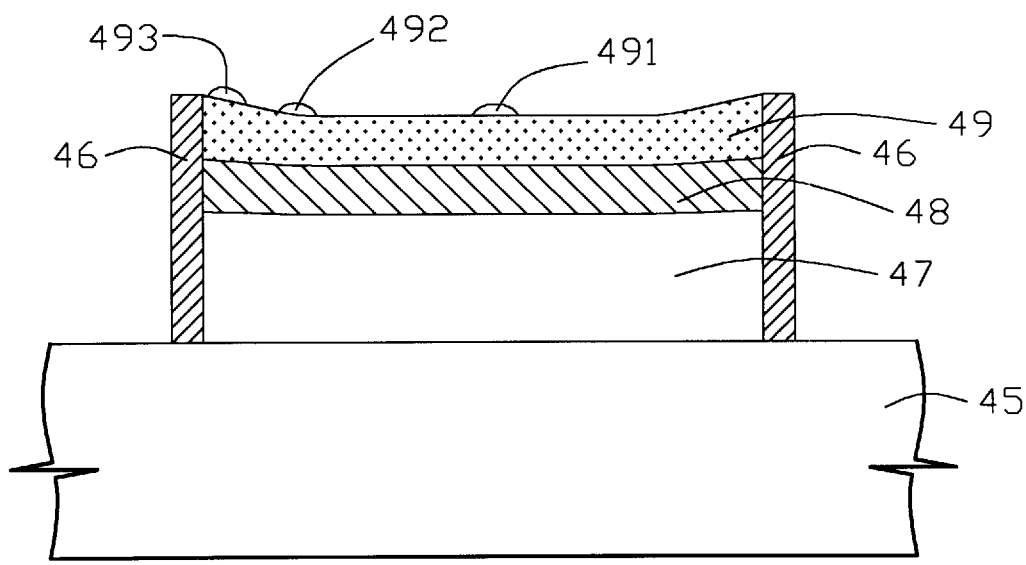

Referring to FIG. 4B where die seal ring 46 proposed by the invention is used. Die is formed on substrate 45 and is enclosed by die seal ring 46, wherein the die includes a plurality of structures 47, passivation layer 48 and color filter layer 49. And a plurality of microlens are also formed on color layer 49. But also in order to simplify FIG. 4B, only three microlens 491, 492 and 493 are illustrated.

Significantly, through center parts of both passivation layer 48 and color filter layer 49 are briefly smooth and the edge parts of both passivation layer 48 and color filter layer 49 are upwardly flexural. But owing to the fact that the height of die seal ring 46 is less than die seal ring 41, it is natural that the surface of passivation layer 48 is smoother than passivation layer 43, and the surface of color filter layer 49 is smoother than color filter layer 44. Thus, that performance of microlens 491 is approximately equal to the performance of microlens 441, performance of microlens 492 is slight better than performance of microlens 442, and performance of microlens 493 is significant better than performance of microlens 443. In other words, performance of microlens 491, 492 and 493 are approximately equivalent, at least variance of performance between different microlens is significantly decreased by die seal ring 46.

In summary, because microlenses that locate on different positions have approximately equivalent performance, such as luminousness, pixel cells that locate on different portion of substrate 40 also will have approximately equivalent sensitivity. Quality of the photodetector is improved by applying of die seal ring 46.

Having described the invention in connection with a preferred embodiment, modification will now doubtlessly suggest itself to those skilled in this technology. The foregoing description of the preferred embodiment of the invention has been provided for the purposes of illustration and description. It is not intended to be exhaustive or to limit the invention to the precise embodiment disclosed. The disclosed embodiment was chose and described or to best explain the principles of the invention and its practical applications. Thereby enabling other skilled in this technology to understand the invention. To practices various other embodiment thereof and to make various modifications suited to the particular use contemplated of the present invention. As such, it is intended that the scope of this invention shall not be limited to the disclosed, but ratter it is to be defined by the following claims and their equivalents.

What is claimed is:

1. A die seal ring that is formed on a substrate and surround a die, said die seal ring comprising:

a plurality of dielectric layers which are successively formed on and over said substrate; and a plurality of metal structures each having a metal ring and an underlying metal plug being stacked on and electrically coupled to said substrate, wherein said metal ring is located in said dielectric layers and surrounds said die, each of said metal rings being located on one of said dielectric layers and being covered by one adjacent said dielectric layer while different said metal rings are located on different said dielectric layers, wherein said metal structures are separately located over said substrate without overlap thereamong.

2. The seal ring according to claim 1, further comprises a plurality of isolations that locate between one of said metal plugs and one adjacent said dielectric layer.

3. The seal ring according to claim 2, wherein said isolations comprises field oxides.

4. The seal ring according to claim 1, further comprises an isolations that is located between said metal plugs and said die.

5. The seal ring according to claim 1, wherein said substrate further comprising a diffusion region, said metal plugs are connected to said diffusion region.

6. The seal ring according to claim 5, wherein said diffusion region is connected to a ground point.

7. The seal ring according to claim 1, wherein said dielectric layers comprise a passivation layer.

8. The seal ring according to claim 7, wherein said passivation layer is uppermost layer of said dielectric layers.

9. The seal ring according to claim 1, wherein said dielectric layers comprise borophospho-teratthyl-orthosilicate layer.

10. The seal ring according to claim 9, wherein said borophospho-teratthyl-orthosilicate layer is nethermost layer of said dielectric layers.

11. The seal ring according to claim 1, wherein material of said metal ring comprises aluminum.

12. The seal ring according to claim 1, wherein material of said metal ring comprises copper.

13. The seal ring according to claim 1, wherein material of said metal plug comprises copper.

14. The seal ring according to claim 1, wherein material of said metal plug comprises tungsten.

15. The seal ring according to claim 1, further comprising a planimetric layer on said dielectric layers.

16. The seal ring according to claim 1, further comprises at least an appendant metal ring in any specific metal plug whose aspect ratio is too larger to be properly formed, said appendant metal ring also surround said die.

17. The seal ring according to claim 16, wherein each of said appendant metal rings is formed on one of said dielectric layers and is covered by one adjacent said dielectric layers.

* * * * *